United States Patent
Kakushima et al.

(10) Patent No.: US 11,942,490 B2
(45) Date of Patent: Mar. 26, 2024

(54) PHOTON COUNTING RADIATION DETECTOR AND RADIOGRAPHIC INSPECTION DEVICE USING THE SAME

(71) Applicants: KABUSHIKI KAISHA TOSHIBA, Tokyo (JP); TOSHIBA MATERIALS CO., LTD., Yokohama (JP)

(72) Inventors: Kuniyuki Kakushima, Yokohama Kanagawa (JP); Akito Sasaki, Yokohama Kanagawa (JP); Atsuya Sasaki, Yokohama Kanagawa (JP); Hideaki Hirabayashi, Yokohama Kanagawa (JP)

(73) Assignees: KABUSHIKI KAISHA TOSHIBA, Tokyo (JP); TOSHIBA MATERIALS CO., LTD., Yokohama (JP)

(*) Notice: Subject to any disclaimer, the term of this patent is extended or adjusted under 35 U.S.C. 154(b) by 527 days.

(21) Appl. No.: 17/178,791

(22) Filed: Feb. 18, 2021

(65) Prior Publication Data
US 2021/0175268 A1 Jun. 10, 2021

Related U.S. Application Data

(63) Continuation of application No. PCT/JP2019/040962, filed on Oct. 17, 2019.

(30) Foreign Application Priority Data
Oct. 25, 2018 (JP) .................... 2018-200616

(51) Int. Cl.
*H01L 27/146* (2006.01)
*G01T 1/24* (2006.01)
(Continued)

(52) U.S. Cl.
CPC ........ *H01L 27/14607* (2013.01); *G01T 1/241* (2013.01); *H01L 27/14659* (2013.01);
(Continued)

(58) Field of Classification Search
CPC ......... H01L 27/14607; H01L 27/14659; H01L 31/022408; H01L 31/028; H01L 31/0296;
(Continued)

(56) References Cited

U.S. PATENT DOCUMENTS 4,255,659 A * 3/1981 Kaufman .............. G01T 1/2928
378/19
5,821,540 A 10/1998 Sato
(Continued)

FOREIGN PATENT DOCUMENTS

EP 2 088 451 A1 8/2009
JP S56-41278 U 4/1981
(Continued)

*Primary Examiner* — Kiho Kim
(74) *Attorney, Agent, or Firm* — Foley & Lardner LLP

(57) ABSTRACT

A photon counting radiation detector includes a cell structure including a substrate and an epitaxial layer provided on the substrate, radiation being incident on the epitaxial layer; an inclination θ of the substrate being set in a predetermined range, where $t_{sub}$ is a thickness of the substrate, $t_{epi}$ is a thickness of the epitaxial layer, L is a length of the substrate, and the inclination θ is an inclination of the substrate with respect to an incident direction of the radiation. The epitaxial layer is preferably one type selected from SiC, $Ga_2O_3$, GaAs, GaN, diamond, and CdTe. Such a photon counting radiation detector is preferably a direct converting type.

13 Claims, 14 Drawing Sheets

(51) Int. Cl.
    *H01L 31/0224* (2006.01)
    *H01L 31/028* (2006.01)
    *H01L 31/0296* (2006.01)
    *H01L 31/0304* (2006.01)
    *H01L 31/0312* (2006.01)
    *H01L 31/032* (2006.01)

(52) U.S. Cl.
    CPC .... *H01L 31/022408* (2013.01); *H01L 31/028* (2013.01); *H01L 31/0296* (2013.01); *H01L 31/0304* (2013.01); *H01L 31/03044* (2013.01); *H01L 31/0312* (2013.01); *H01L 31/032* (2013.01)

(58) Field of Classification Search
    CPC ........... H01L 31/0304; H01L 31/03044; H01L 31/0312; H01L 31/032; H01L 31/115; H01L 27/14601; G01T 1/241; G01T 1/24
    See application file for complete search history.

(56) References Cited

U.S. PATENT DOCUMENTS

| | | |
|---|---|---|
| 2006/0056581 A1 | 3/2006 | Hoffman et al. |
| 2007/0003006 A1 | 1/2007 | Tkaczyk et al. |
| 2010/0204942 A1 | 8/2010 | Danielsson |
| 2010/0215230 A1 | 8/2010 | Bornefalk |
| 2014/0138553 A1 | 5/2014 | Ogawa |
| 2015/0380457 A1 | 12/2015 | Fujii |

FOREIGN PATENT DOCUMENTS

| | | |
|---|---|---|
| JP | S63-40381 A | 2/1988 |
| JP | H09-275223 A | 10/1997 |
| JP | 4886151 B2 | 2/2012 |
| JP | 2012-517604 A | 8/2012 |
| JP | 2014-160042 A | 9/2014 |
| WO | WO-02/063339 A1 | 8/2002 |
| WO | WO-2004/038810 A2 | 5/2004 |
| WO | WO-2012/086648 | 6/2012 |

* cited by examiner

PHOTON COUNTING RADIATION DETECTOR AND RADIOGRAPHIC INSPECTION DEVICE USING THE SAME

CROSS-REFERENCE TO RELATED APPLICATIONS

This is a continuation application of International Patent Application PCT/JP2019/040962, filed on Oct. 17, 2019. This application also claims priority to Japanese Patent Application No. 2018-200616, filed on Oct. 25, 2018. The entire contents of which are incorporated herein by reference.

FIELD

One or more embodiments generally relate to a photon counting radiation detector and a radiographic inspection device using the same.

BACKGROUND

Radiographic inspection devices are used in various fields as medical devices, industrial non-destructive inspection devices, and the like. Examples of such medical devices include computed tomography (CT) devices and positron emission tomography (PET) devices. Also, the radiation used may be X-rays, gamma rays, or the like.

As described in JP 4886151B (Patent Document 1), generally, a luminescent material called a solid scintillator is used in X-ray CT devices. The solid scintillator is a substance that emits light when irradiated with X-rays. An X-ray CT device that uses a solid scintillator converts X-rays passing through a test subject into visible light via the solid scintillator. The visible light is converted into an electrical signal via a photodiode detector to obtain a tomogram. Currently, this technique has developed to the stage where three-dimensional images can be obtained. On the other hand, in methods of detecting the light emitting from a solid scintillator as an electrical signal, there is a loss when X-rays are converted into light and there are limits to the improvements that can be made to the light sensitivity of photodiodes. These factors have limited how much the X-ray exposure amount can be reduced. Also, the solid scintillator being a polycrystalline body has limited how much the solid scintillator can be reduced in size. This has limited improvements in spatial resolution. Furthermore, systems for converting only the light emitting from the solid scintillator into an electrical signal have had the problem of a low amount of X-ray information.

In recent years, the development of a radiation detector in which the radiation passing through a test subject is converted directly into an electrical signal has been progressing. In JP S63-40381A (Patent Document 2), a radiation detector installed with a photon counting radiation detector is described. In a photon counting system, X-ray photons passing through a test subject can be directly converted into an electrical signal. This technology is expected to allow the exposure amount to be reduced and other advantages.

DETAILED DESCRIPTION

A photon counting radiation detector according to one or more embodiments includes: a cell structure including a substrate, and an epitaxial layer provided on the substrate, radiation being incident on the epitaxial layer; an inclination $\theta$ of the substrate satisfying Formula (1) below, where $t_{sub}$ is a thickness of the substrate, $t_{epi}$ is a thickness of the epitaxial layer, L is a length of the substrate, and the inclination $\theta$ is an inclination of the substrate with respect to an incident direction of the radiation.

$$\theta \leq \tan \theta \leq \frac{L \pm \sqrt{L^2 - 4t_{sub}(t_{sub} + t_{epi})}}{2(t_{sub} + t_{epi})}. \quad (1)$$

Figure 1:
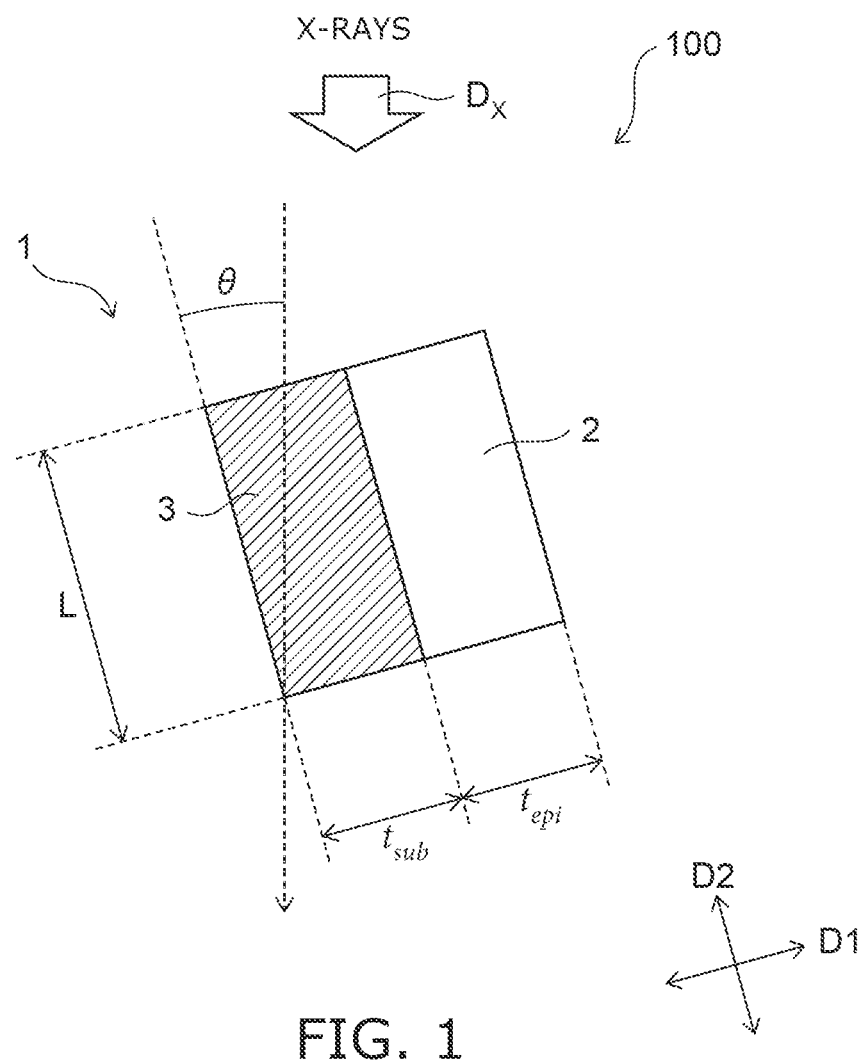
FIG. 1 is a schematic diagram illustrating an example of a photon counting radiation detector according to an embodiment.

FIG. 1 illustrates an example of the cell structure. In FIG. 1, 1 denotes the cell structure, 2 denotes the epitaxial layer, 3 denotes the substrate, 100 denotes the photon counting radiation detector, $t_{sub}$ denotes the thickness of the substrate, $t_{epi}$ denotes the thickness of the epitaxial layer 2, L denotes the length of the substrate, and $\theta$ denotes the inclination of the substrate with respect to an X-ray incident direction. The photon counting radiation detector 100 includes the cell structure 1. The photon counting radiation detector is formed by disposed wiring, an insulating layer, and the like (not illustrated) in the cell structure. Herein, the cell structure will mainly be described. Also, the photon counting radiation detector 100 is capable of detecting radiation, such as X-rays and gamma rays. In the example described herein, the photon counting radiation detector 100 detects X-rays. The technology described below can also be applied in a similar manner to a photon counting radiation detector 100 that detects gamma rays.

Figure 2:
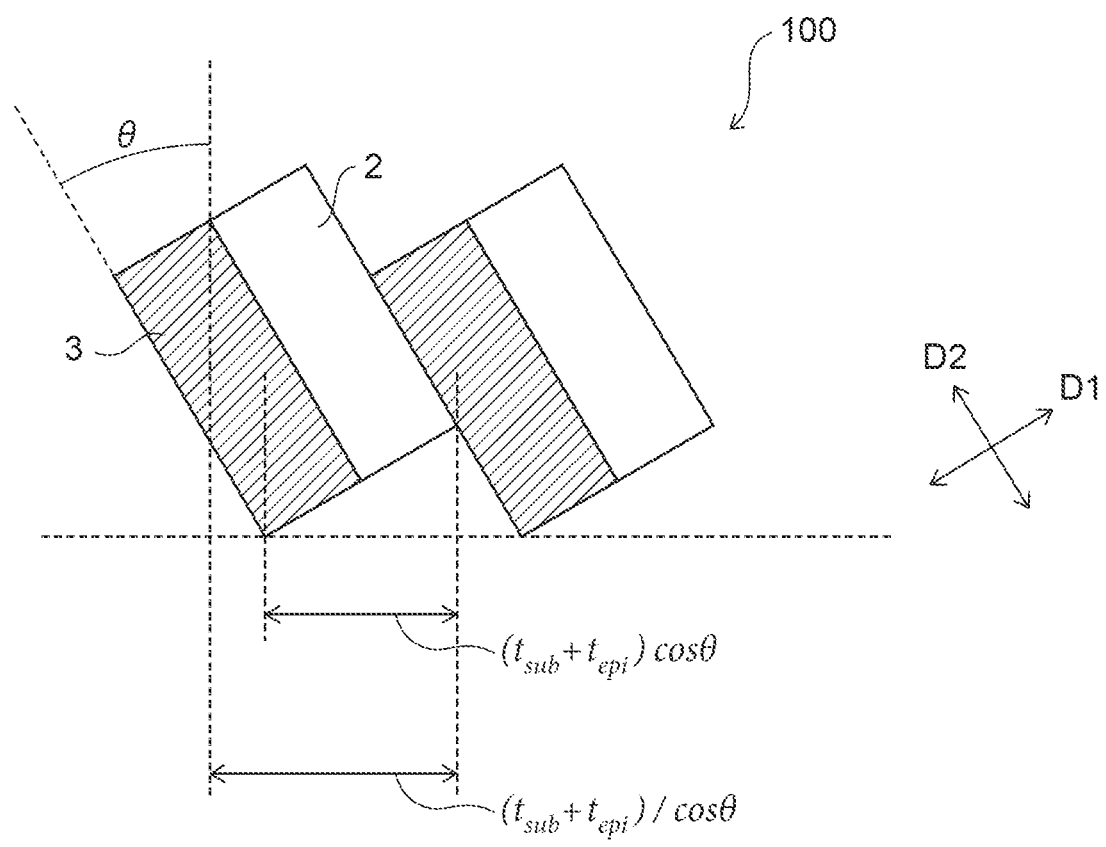
FIG. 2 is a schematic diagram illustrating an example of an array structure according to an embodiment.

FIG. 2 illustrates an example of an array structure including cell structures arranged side by side. In FIG. 2, 2 denotes the epitaxial layer, 3 denotes the substrate, $t_{sub}$ denotes the thickness of the substrate, $t_{epi}$ denotes the thickness of the epitaxial layer 2, $\theta$ denotes the inclination of the substrate with respect to an X-ray incident direction, 6 denotes a spacer, and 10 denotes the array structure. Note that the thickness $t_{sub}$ of the substrate is a value that includes the thickness of the substrate, the electrode, and the insulating layer.

The thickness $t_{sub}$ of the substrate is, in other words, the length of the substrate 3 in a first direction D1 connecting the epitaxial layer 2 and the substrate 3. The thickness $t_{epi}$ of the epitaxial layer is the length of the epitaxial layer 2 in the first direction D1. The length L of the substrate is the length of the substrate 3 in a second direction D2 perpendicular to the first direction D1. The second direction D2 is parallel with a plane that runs in both the first direction D1 and an X-ray incident direction $D_X$. The inclination θ corresponds to the angle between the X-ray incident direction and the second direction D2.

The relationship between the thickness $t_{sub}$ of the substrate, the thickness $t_{epi}$ of the epitaxial layer, the length L of the substrate, and the inclination θ of the substrate satisfies the following Formula (2).

$$\left(L - \frac{t_{sub}}{\tan\theta}\right)\sin\theta = \frac{t_{sub} + t_{epi}}{\cos\theta} - (t_{sub} + t_{epi})\cos\theta \quad (2)$$

The cell structure includes the substrate 3 and the epitaxial layer 2 provided on the substrate 3. The substrate of the cell structure is inclined with respect to the X-ray incident direction. Note that for the inclination θ of the substrate, the X-ray incident direction is 0°. Also, when the substrate is inclined to the down and right, θ is a positive angle. When the substrate is inclined to the down and left, θ is a negative angle. In the state illustrated in FIG. 2, θ is a positive angle. Also, in Formula (2), the inclination θ of the substrate 3 is an absolute value. In other words, in Formula (2), the inclination θ is given as a positive angle even when it is a negative angle. The incident direction is perpendicular to the direction in which the plurality of cell structures 1 are arranged side by side, for example.

The substrate 3 is used to form the epitaxial layer 2. Also, the epitaxial layer 2 is capable of converting incident X-ray photons into electrical signals. By the epitaxial layer being present continuously with respect to the X-ray incident direction, the regions incapable of detecting X-ray photons can be reduced. However, the plurality of cell structures need to be disposed without overlapping the epitaxial layers 2 of adjacent cell structures with respect to the X-ray incident direction. If adjacent epitaxial layers 2 are overlapped, contamination occurs when X-ray photons are detected. As a result, X-ray photons are unable to be accurately detected. Contamination is image blur caused by a plurality of the epitaxial layers 2 detecting the same X-ray photon. In Patent Document 2, contamination of X-ray photon detection is prevented by covering the semiconductor element with a shielding material. Lead is used in the shielding material. However, lead is a toxic material that is hard to use.

In the cell structure according to one or more embodiments, the inclination θ of the substrate with respect to the X-ray incident direction is set within a specific range. By setting the inclination of the substrate depending on the thickness of the substrate, the length of the substrate, and the thickness of the epitaxial layer, the regions incapable of detection can be reduced and detection contamination can be suppressed.

Formula (2) will now be described.

First, as illustrated in FIG. 2, $[(t_{sub}+t_{epi})/\cos\theta - (t_{sub}+t_{epi})\cos\theta]$ must take a value equal to or greater than 0. $(t_{sub}+t_{epi})/\cos\theta$ is the width of a single epitaxial layer 2 as seen from the X-ray incident direction. $(t_{sub}+t_{epi})/\cos\theta$ is the pixel size. $(t_{sub}+t_{epi})\cos\theta$ is the width from the lower end portion of the substrate 3 to the lower end portion of the epitaxial layer 2 as seen from the X-ray incident direction. The width is, in other words, the length in the direction perpendicular to the X-ray incident direction and in the direction in which the cell structures 1 are arranged.

As $[(t_{sub}+t_{epi})/\cos\theta - (t_{sub}+t_{epi})\cos\theta]$ approaches zero, the angle between the inclination θ of the substrate 3 and the X-ray incident direction decreases.

Also, the relationship of Formula (3) is applied so that adjacent cell structures are disposed with the epitaxial layers 2 not overlapped with respect to the X-ray incident direction.

$$L - \frac{t_{sub}}{\tan\theta} = (t_{sub} + t_{epi})\left(\frac{1+\tan^2\theta}{\tan\theta} - \frac{1}{\tan\theta}\right) = (t_{sub} + t_{epi})\tan\theta \quad (3)$$

Formula (3) is represented by Formula (4).

$$0 \leq L^2 - 4t_{sub}(t_{sub}+t_{epi}) \quad (4)$$

From Formula (4), the relationship of Formula (1) is satisfied for the inclination θ of the substrate.

$$\theta \leq \tan\theta \leq \frac{L \pm \sqrt{L^2 - 4t_{sub}(t_{sub} + t_{epi})}}{2(t_{sub} + t_{epi})} \quad (1)$$

Also, the following Formula (4) is satisfied.

$$0 \leq L^2 - 4t_{sub}(t_{sub}+t_{epi}) \quad (4)$$

Formula (1) being satisfied for the inclination θ of the substrate 3 means that adjacent cell structures are disposed with the epitaxial layers 2 not overlapped with respect to the X-ray incident direction.

If the epitaxial layers 2 of adjacent cell structures are overlapped with respect the X-ray incident direction, image blur occurs. This is because a single X-ray photon is detected by two cells.

Also, the inclination θ of the substrate is an absolute value of the angle of the substrate with respect to the X-ray incident direction. Thus, the angle of the substrate with respect to the X-ray incident direction may be a positive angle or a negative angle. Also, the inclination θ of the substrate is preferably a value greater than 0°. When the inclination θ of the substrate is 0°, the substrate is parallel with the X-ray incident direction. When the inclination θ of the substrate is 0°, contamination (image blur) of the detection by adjacent cell structures does not occur. However, the region of the thickness $t_{sub}$ of the substrate 3 is made a region incapable of detecting X-ray photons. In other words, when a gap is formed between the epitaxial layers 2 of adjacent cell structures with respect to the X-ray incident direction, a region incapable of detection is formed.

Also, increasing the inclination θ of the substrate makes $(t_{sub}+t_{epi})/\cos\theta$ decrease. This allows the pixels to be made smaller. In other words, by adjusting the inclination θ of the substrate while satisfying Formula (1), image blur can be prevented and the pixels can be made smaller.

Thus, the inclination θ of the substrate 3 is preferably a value greater than 0°, while satisfying Formula (1). By setting the inclination θ of the substrate 3 within this range, detection contamination suppression and higher resolution can both be achieved in a compatible manner.

The cell structure includes the epitaxial layer 2 provided on the substrate 3. The epitaxial layer 2 preferably includes one type selected from SiC, $Ga_2O_3$, GaAs, GaN, diamond, and CdTe. Also, the substrate 3 preferably includes one type selected from SiC, $Ga_2O_3$, GaAs, GaN, diamond, and CdTe. Furthermore, the epitaxial layer 2 is preferably a layer grown epitaxially on the substrate 3. Because of this, the materials of the epitaxial layer 2 and the substrate 3 are preferably the same. Also, the epitaxial layer 2 and the substrate 3 are preferably made from SiC or $Ga_2O_3$. Epitaxial growth on the substrate is easy when these materials are used. Also, the substrate can be easily thinned using the etching process described below. Furthermore, because X-rays pass through these substrate materials, there are no negative effects on the detection of X-rays via the epitaxial layer 2. The epitaxial layer 2 and the substrate 3 may be made of a single crystal.

Also, when SiC is used in the epitaxial layer 2, 4H—SiC is preferably used. SiC polytypes include 4H—SiC, 6H—SiC, and 3C—SiC. Of these, 4H—SiC has the largest band gap of 3.25 eV. By using a material with a large band gap, leakage current can be reduced. These materials also allow for operations at room temperature.

The epitaxial layer 2 is a high-quality layer compared to the substrate 3. Specifically, the impurity concentration and the density of defect states of the epitaxial layer 2 per unit volume is less than those of the substrate 3 by at least two orders of magnitude. For example, when the impurity concentration of a SiC substrate is approximately $10^{18}$ $cm^{-3}$, the impurity concentration of a SiC epitaxial layer is $10^{16}$ $cm^{-3}$ or less.

The same holds true for the density of defect states. Also, the epitaxial layer 2 and the substrate 3 are discernable by observing the cross-sectional structure. The epitaxial layer 2 has a higher density than the substrate 3. In particular, by using a single-crystal substrate, the epitaxial layer 2 can also be single crystal. When a single-crystal substrate 3 is used, a high-quality epitaxial layer can be easily formed.

Also, the amount of impurities can be calculated from the relationship between the reverse voltage and the depletion layer capacitance. The reverse voltage is set as V, the depletion layer capacitance is set as C, the Schottky barrier is set as $\varphi_B$, the load is set as q, the impurity concentration is set as $N_d$, and the dielectric constant of the material is set as ε. The relationship between the reverse voltage V and the depletion layer capacitance C satisfies the relationship formula: $1/C^2 = -2(V-\varphi_B)/qN_d\varepsilon$.

The dielectric constant ε of the material is the dielectric constant of the material the epitaxial layer 2 and the substrate 3 are made of. For example, the dielectric constant ε of SiC is 9.7, the dielectric constant ε of GaN is 9.0, the dielectric constant ε of $Ga_2O_3$ is 10.0, and the dielectric constant ε of diamond is 5.5.

By measuring the reverse voltage V and the depletion layer capacitance C ($1/C^2$), the impurity concentration $N_d$ can be calculated using the relationship formula described above. The impurity concentration $N_d$ is also referred to as donor concentration.

Also, for the reverse voltage V, preferably an LCR meter capable of applying a high voltage of approximately −200 V is used. By applying a high voltage, depletion of the substrate 3 begins after the depletion of the epitaxial layer 2. This allows measurements to be performed with the epitaxial layer 2 and the substrate 3 in an integrally formed state.

Also, by setting the inclination θ of the substrate to a predetermined value, the side surface of the epitaxial layer 2 can be an X-ray incident surface. This allows the incident surface to be made smaller. By making the incident surface smaller, the detection pixels can be made smaller. Also, the thickness $t_{epi}$ of the epitaxial layer is preferably 100 μm or less. The thickness $t_{epi}$ of the epitaxial layer is more preferably 30 μm or less, and even more preferably 10 μm or less. A thin thickness $t_{epi}$ allows the detection pixels to be made smaller. The minimum value of the thickness $t_{epi}$ of the epitaxial layer 2 is not particularly limited, but is preferably 1 μm or greater. A thickness $t_{epi}$ of less than 1 μm produces an electrical signal that is too small.

The thickness $t_{sub}$ of the substrate is preferably 500 μm or less. When the thickness $t_{sub}$ of the substrate is greater than 500 μm, regions incapable of detection may increase. Thus, the thickness $t_{sub}$ of the substrate is preferably 500 μm or less, and more preferably 100 μm or less. Also, the lower limit value of the thickness $t_{sub}$ of the substrate is not particularly limited, but is preferably 5 μm or greater. When the thickness $t_{sub}$ of the substrate is less than 5 μm, the strength of the substrate is reduced. A substrate with low strength may be easily damaged when the array structure is assembled. Thus, the thickness $t_{sub}$ of the substrate preferably ranges from 5 μm to 500 μm, and more preferably ranges from 5 μm to 100 μm. By making the substrate thin, the regions incapable of detection can be reduced and the spatial resolution can be improved. Also, the thickness of the substrate can be adjusted by using a substrate with a predetermined thickness or by thinning the substrate via machining/finishing or etching. Furthermore, the thickness of the electrode, the insulating layer, and the like are included in the thickness $t_{sub}$ of the substrate.

An electrode is preferably provided in the cell structure. The electrode provided in the cell structure preferably includes one or more types selected from the group consisting of carbon, silicon, titanium, platinum, and nickel.

Figure 3:
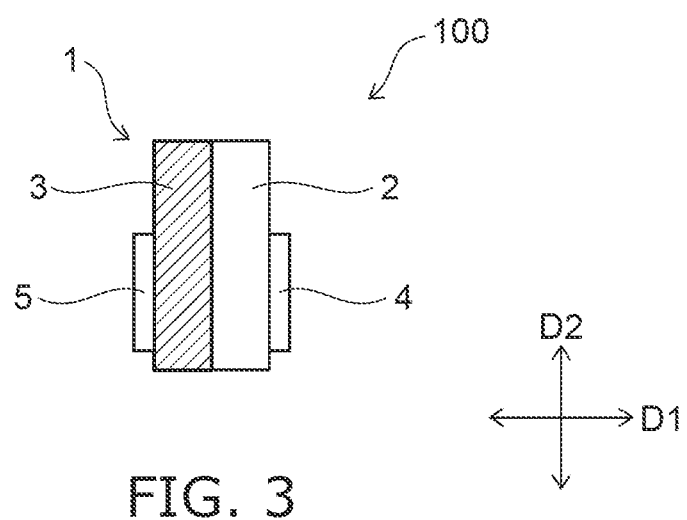
FIG. 3 is a schematic diagram illustrating another example of a photon counting radiation detector according to an embodiment.

FIG. 3 illustrates an example of a cell structure provided with electrodes. In FIG. 3, 1 denotes the cell structure, 2 denotes the epitaxial layer, 3 denotes the substrate, 4 denotes a front electrode, 5 denotes a rear electrode, and 100 denotes the photon counting radiation detector. In FIG. 3, the electrode provided on the side the epitaxial layer 2 is provided on corresponds to the front electrode 4, and the electrode provided on the side of the substrate 3 corresponds to the rear electrode 5. Also, in FIG. 3, the cell structure is illustrated as seen from the side surface. The front electrode 4 is provided on the entire surface or a portion of the epitaxial layer 2. Also, a plurality of the front electrodes 4 may be provided on the front surface of the epitaxial layer 2.

The rear electrode 5 is provided on the entire surface or a portion of the rear surface of the substrate 3. Also, a plurality of the rear electrodes 5 may be provided on the rear surface of the substrate 3.

The thickness $t_{sub}$ of the substrate corresponds to the sum of the thickness of the substrate 3, the thickness of the front electrode 4, and the thickness of the rear electrode 5.

Also, the electrode material is preferably one type selected from a metal, a metal oxide, a metal carbide, and a metal silicide.

For a metal electrode, one type selected from titanium (Ti), tungsten (W), molybdenum (Mo), tantalum (Ta), niobium (Nb), platinum (Pt), and nickel (Ni) is preferably used. For a metal oxide electrode, titanium oxide ($TiO_2$) is preferably used. For a metal carbide electrode, one type selected from titanium carbide (TIC), tungsten carbide (WC), molybdenum carbide ($Mo_2C$), tantalum carbide (TaC), and niobium carbide (NbC) is preferably used. For a metal silicide electrode, one type selected from titanium silicide ($TiSi_2$), tungsten silicide ($WSi_2$), molybdenum silicide ($MoSi_2$), tantalum silicide ($TaSi_2$), and niobium silicide ($NbSi_2$) is preferably used.

When the epitaxial layer 2 and the substrate 3 include silicon carbide (SiC) or diamond, a metal carbide electrode or a metal silicide electrode is preferably provided. Among these, $Mo_2C$, W, WC, and $W_2C$ are preferable. When the epitaxial layer 2 and the substrate 3 include a carbon component, a metal carbide electrode or a metal silicide electrode can be used to help suppress a reaction between the electrode and the epitaxial layer (or the substrate). In this way, stable electrical characteristics can be obtained. Also, the cell structure can have a long service life.

Also, when the epitaxial layer 2 and the substrate 3 include gallium oxide ($Ga_2O_3$), gallium arsenide (GaAs), gallium nitride (GaN), or cadmium telluride (CdTe), a metal electrode or a metal oxide electrode is preferably used. Among these, Pt, Ni, and $TiO_2$ are preferable. Also, titanium nitride (TiN) may be used in the electrode. This can help suppress a reaction between the electrode and the epitaxial layer (or the substrate).

The metal electrode, the metal carbide electrode, and the metal silicide electrode can be formed via sputtering. Methods that may be used other than sputtering include chemical vapor deposition (CVD), ion plating, vapor deposition, thermal spraying, plating, and the like.

Figure 4:
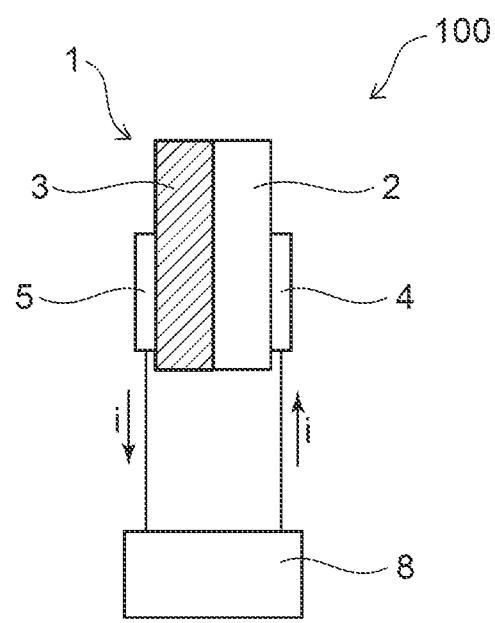
FIG. 4 is a schematic diagram illustrating another example of a photon counting radiation detector according to an embodiment.

FIG. 4 is a schematic diagram illustrating an example of a configuration of a photon counting radiation detector according to one or more embodiments. In FIG. 4, 8 denotes a control unit. The front electrode and the rear electrode of each cell is connected to the control unit 8. A voltage is applied between the front electrode and the rear electrode of each cell by the control unit 8. The X-rays passing through the test subject are incident on the epitaxial layer 2 of the cell structure 1. Incident X-ray photons are absorbed by the epitaxial layer 2. When X-ray photons are absorbed, carriers (electrons and holes) are generated in the epitaxial layer 2. The electrons and holes move toward the front electrode and the rear electrode, respectively. This makes a current i flow between the control unit and the front electrode, and the control unit and the rear electrode, as illustrated in FIG. 4. In other words, in the epitaxial layer 2, the X-ray photons are directly converted into an electrical signal. The control unit 8 detects the magnitude of the current i. The magnitude of the current i is proportional to the number of X-ray photons passing through the test subject. In other words, by detecting the magnitude of the current i, the number of X-ray photons can be counted. Note that the direction of the voltage applied between the front electrode and the rear electrode and the current i can be changed as appropriate.

Figure 5:
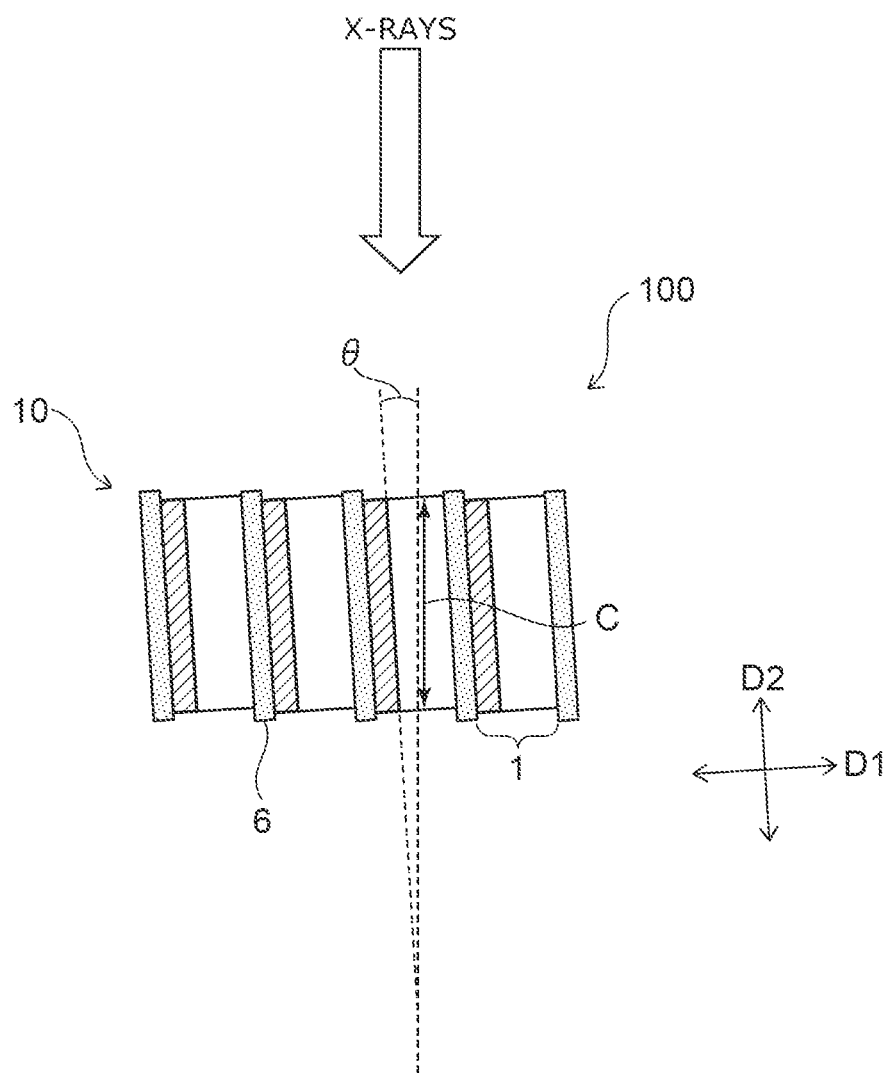
FIG. 5 is a schematic diagram illustrating another example of an array structure according to an embodiment.

The photon counting radiation detector preferably includes an array structure in which cell structures are arranged side by side in the lateral direction interposed by insulating spacers. FIG. 5 illustrates an example of an array structure. The array structure 10 has a structure in which a plurality of the cell structures 1 and a plurality of spacers 6 are alternately arranged side by side. The spacers 6 preferably have insulating properties. As illustrated in FIG. 3, the cell structure 1 is provided with the front electrode 4 and the rear electrode 5. As illustrated in FIG. 4, the front electrode 4 and the rear electrode 5 of each of the cell structures 1 are connected to the control unit 8. Providing insulating spacers allows for conduction between adjacent cell structures to be prevented. For example, the spacer 6 may be an insulating resin (including pressure-sensitive adhesives), an insulating film, or the like. Also, an adhesive layer with an insulating film on both sides, such as double-sided tape, may be used. The thickness of the spacer 6 is preferably 200 µm or less, and more preferably 100 µm or less. By making the thickness of the spacer 6 thin, the regions incapable of detection can be reduced and the spatial resolution can be increased. Note that the number of cell structures arranged side by side is a discretionary number.

When the spacers 6 are provided, the thickness $t_{sub}$ of a single substrate corresponds to the sum of the thickness of a single substrate 3, the thickness of a single front electrode 4, the thickness of a single rear electrode 5, and the thickness of a single spacer 6.

Figure 6:
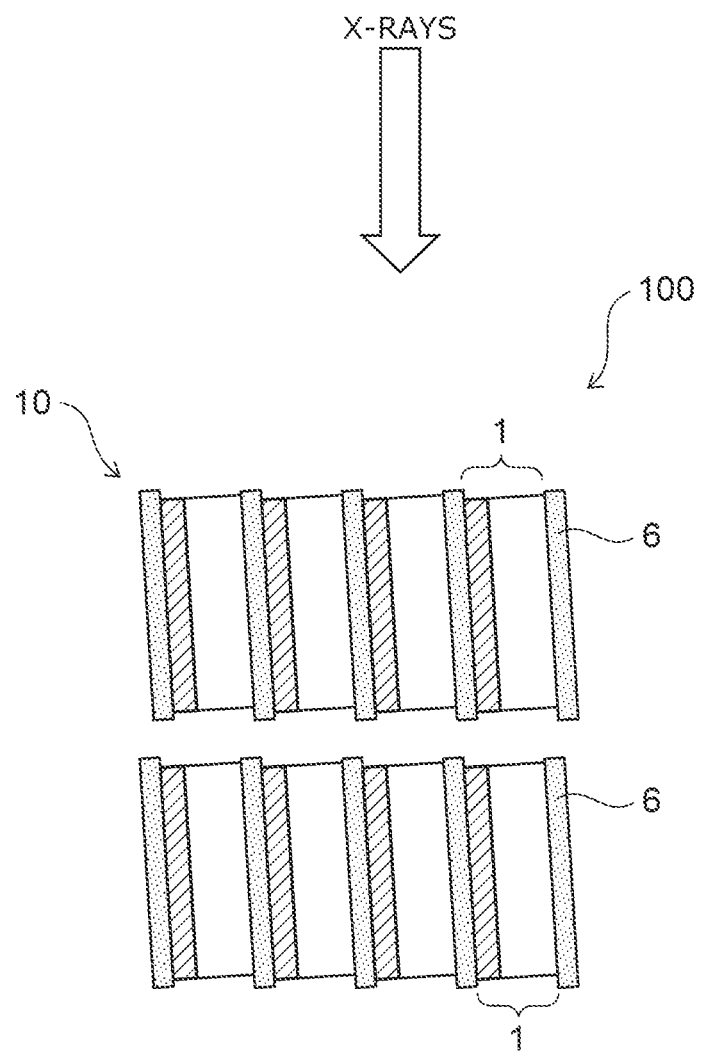
FIG. 6 is a schematic diagram illustrating another example of an array structure according to an embodiment.

As illustrated in FIG. 6, the photon counting radiation detector may have a structure in which the array structures 10 are stacked in the X-ray incident direction. By stacking the array structures 10, which include the cell structures 1 arranged side by side in the lateral direction, in the X-ray incident direction, the amount of information able to be measured at one time can be increased. Also, for a structure including stacked array structures 10, preferably X-rays are passed through the epitaxial layer 2. Note that the size of the epitaxial layers 2 of the cell structures 1 forming the array structures 10 stacked vertically may be the same or may be different. In a similar manner, the inclination θ of the substrates may be the same or may be different. By having different sized epitaxial layers 2 or different inclinations θ, an X-ray transmission distance C can be different between the upper and lower cells. Also, when the array structures 10 are stacked, the upper and lower epitaxial layers may overlap or may not overlap. Note that the upper and lower epitaxial layers overlapping is indicative of a structure in which X-rays passing through the upper epitaxial layer 2 are capable of being detected at the lower epitaxial layer 2. Also, even with a structure in which the array structures 10 are stacked in the X-ray incident direction, the inclinations θ of the substrates are preferably within the range of Formula (1).

Figure 7:
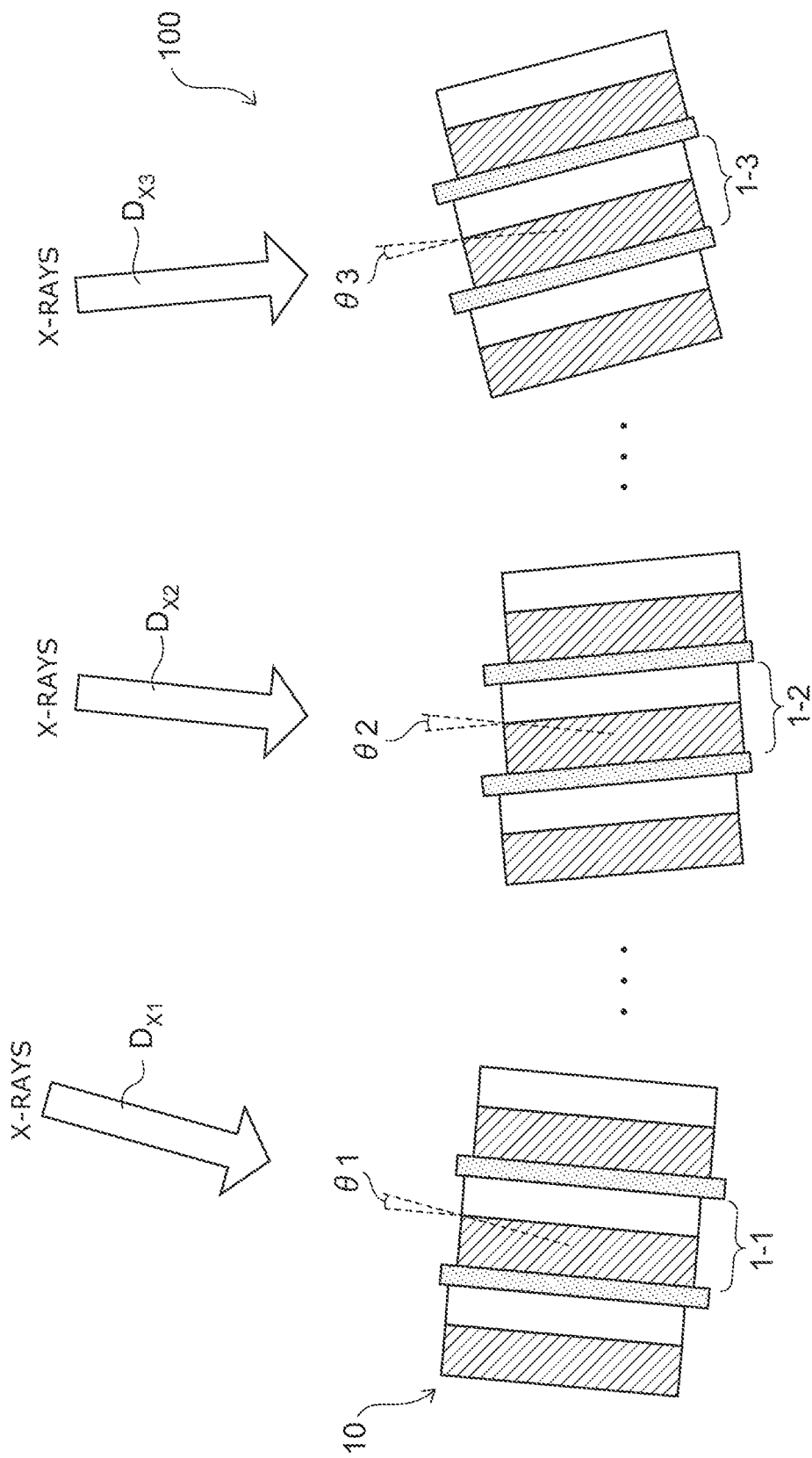
FIG. 7 is a schematic diagram illustrating another example of an array structure according to an embodiment.

FIG. 7 illustrates another example of the array structure 10. In this example, the X-rays are radially emitted from a light source toward a test subject. The X-rays passing through the test subject are incident on the cell structures 1 of the array structure 10. With radially emitted X-rays, the X-ray incident angle is different for each cell structure. For example, the array structure 10 includes a cell structure 1-1, a cell structure 1-3, and a cell structure 1-2 located therebetween in the lateral direction. An incident direction $D_{X1}$ of X-rays for the cell structure 1-1, an incident direction $D_{X2}$ of X-rays for the cell structure 1-2, and an incident direction $D_{X3}$ of X-rays for the cell structure 1-3 are different from one another. In this case, inclinations θ1 to θ3 of the substrates of the cell structures 1-1 to 1-3 are set on the basis of the incident directions $D_{X1}$ to $D_{X3}$ of the X-rays. The inclinations θ1 to θ3 of the substrates of the cell structures 1-1 to 1-3 are set, with respect to the incident directions $D_{X1}$ to $D_{X3}$ of the X-rays, to satisfy Formula (1).

The plurality of cell structures 1 may be arranged side by side in a straight line as illustrated in FIG. 5 or may be arranged side by side along a curve in the lateral direction as illustrated in FIG. 7. Herein, the plurality of cell structures 1 being arranged side by side in the lateral direction includes in its meaning the example illustrated in FIG. 5 of the plurality of cell structures 1 being arranged side by side in a straight line in the lateral direction and the example of the plurality of cell structures 1 being arranged side by side along a curve in the lateral direction.

Figure 8:
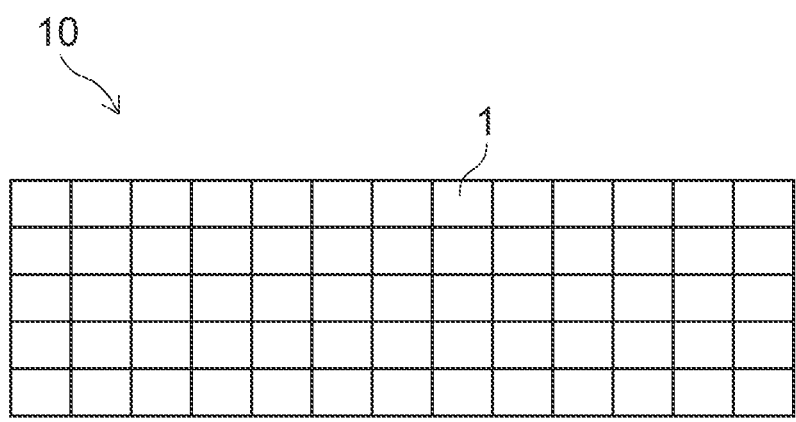
FIG. 8 is a schematic diagram illustrating another example of an array structure according to an embodiment.
Figure 8:
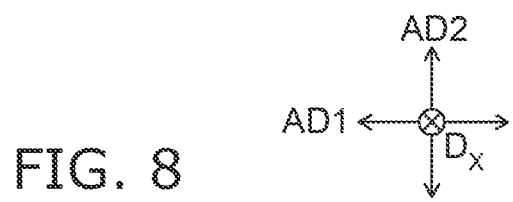

FIG. 8 illustrates another example of the array structure 10. As illustrated in FIG. 8, the cell structures 1 may be arranged in two directions that intersect one another and are perpendicular to the incident direction $D_X$ of the X-rays. For example, the cell structures 1 are arranged in a first arrangement direction AD1 and a second arrangement direction AD2 orthogonal to one another and perpendicular to the incident direction $D_X$. The plurality of cell structures 1 arranged side by side in the first arrangement direction AD1 are arranged as illustrated in FIG. 5 or FIG. 7, for example. The inclinations of the substrates of the cell structures 1 arranged in two directions preferably satisfy Formula (1). Also, the plurality of cell structures 1 arranged in two directions as illustrated in FIG. 8 may be stacked in the X-ray incident direction $D_X$ as illustrated in FIG. 6.

Figure 9:
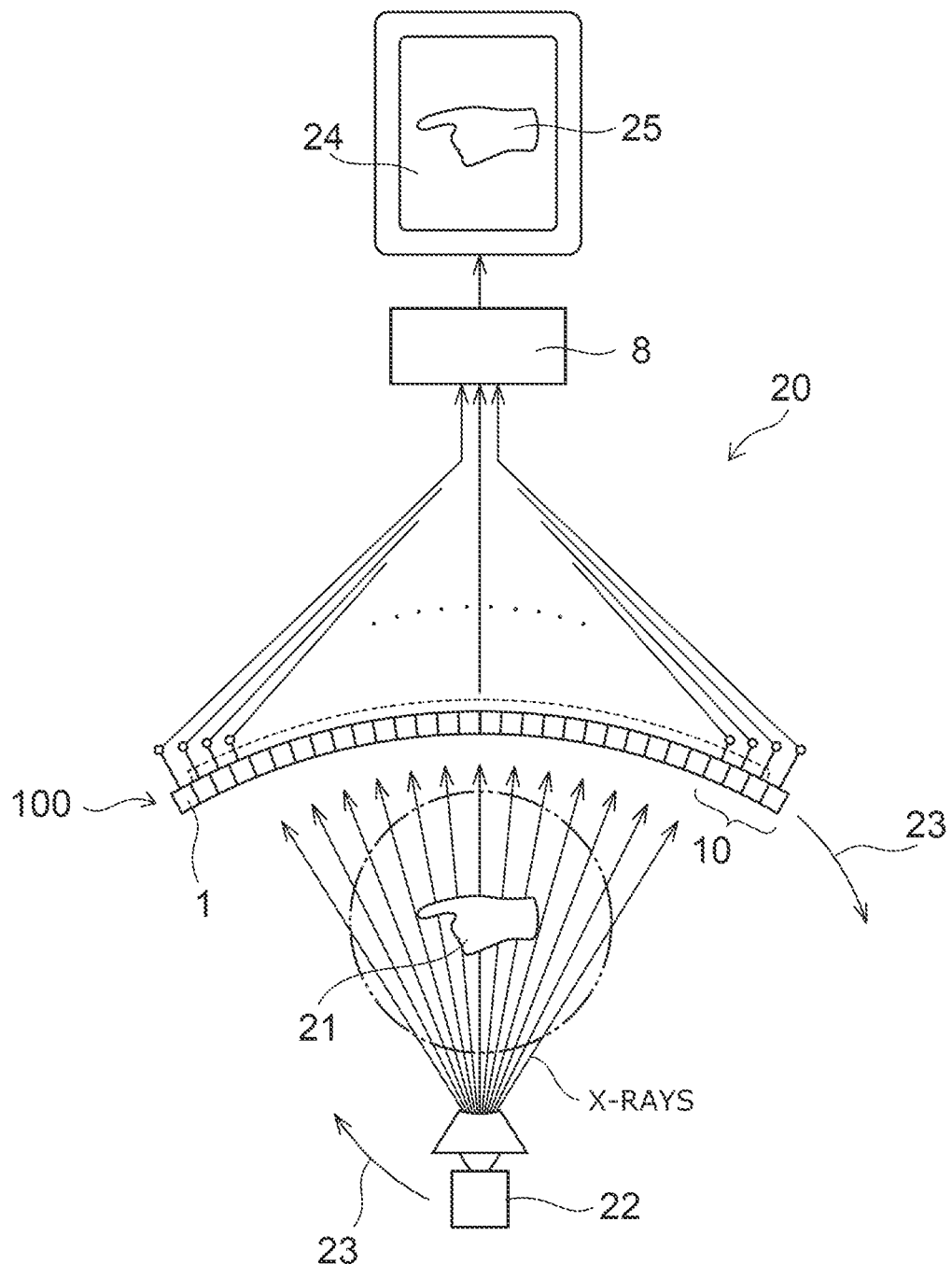
FIG. 9 is a diagram illustrating an example of a radiographic inspection device according to an embodiment.
Figure 10:
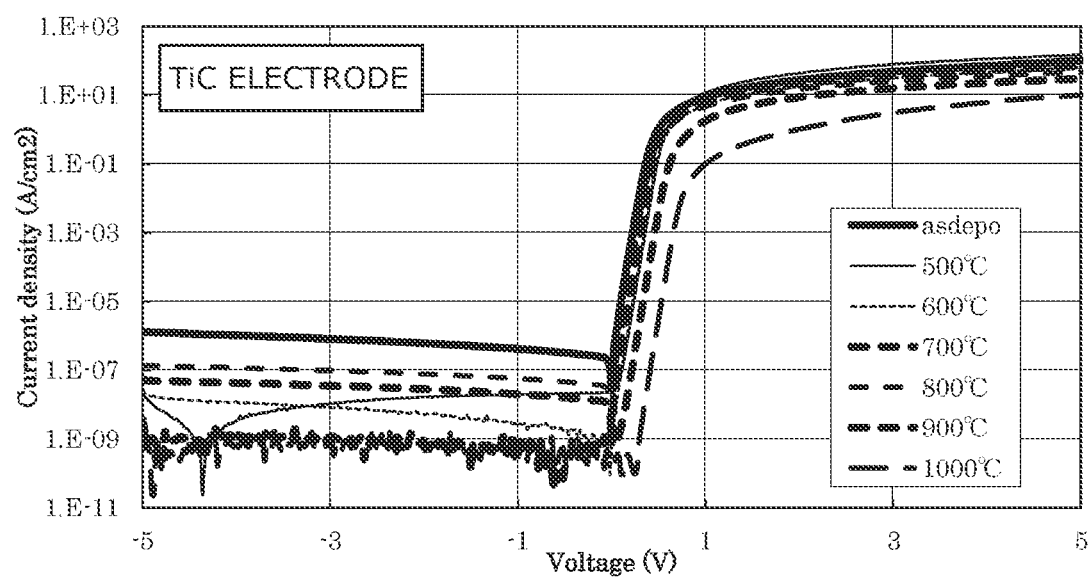
FIG. 10 is a diagram illustrating the I-V characteristics of a cell structure according to Example 2-1.
Figure 11:
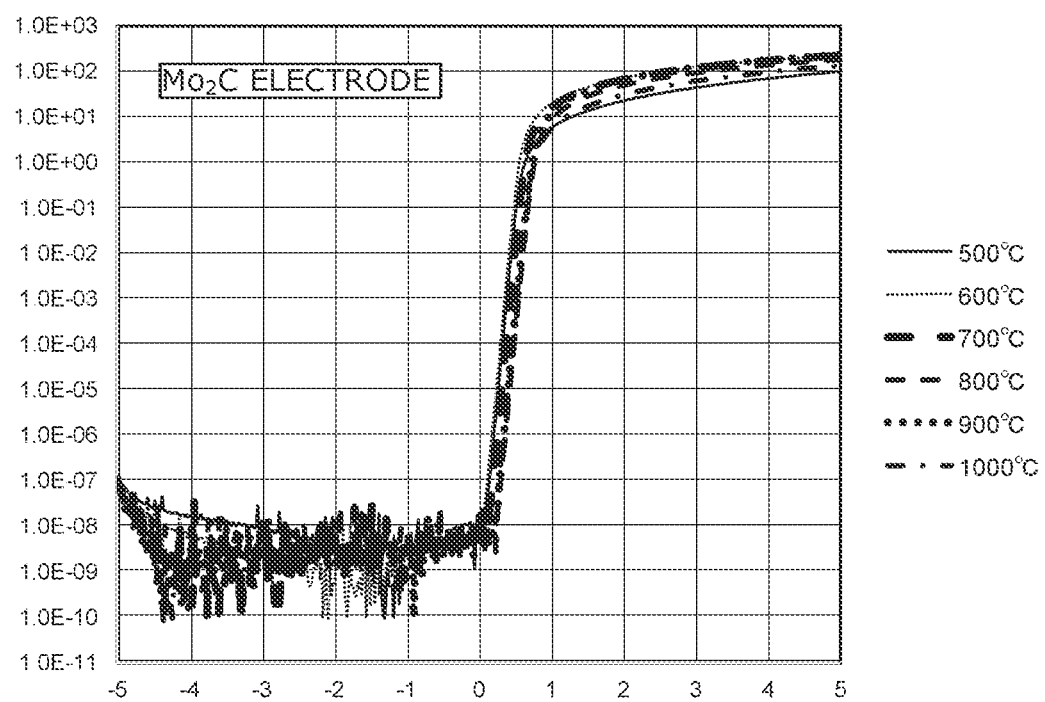
FIG. 11 is a diagram illustrating the I-V characteristics of a cell structure according to Example 2-2.
Figure 12:
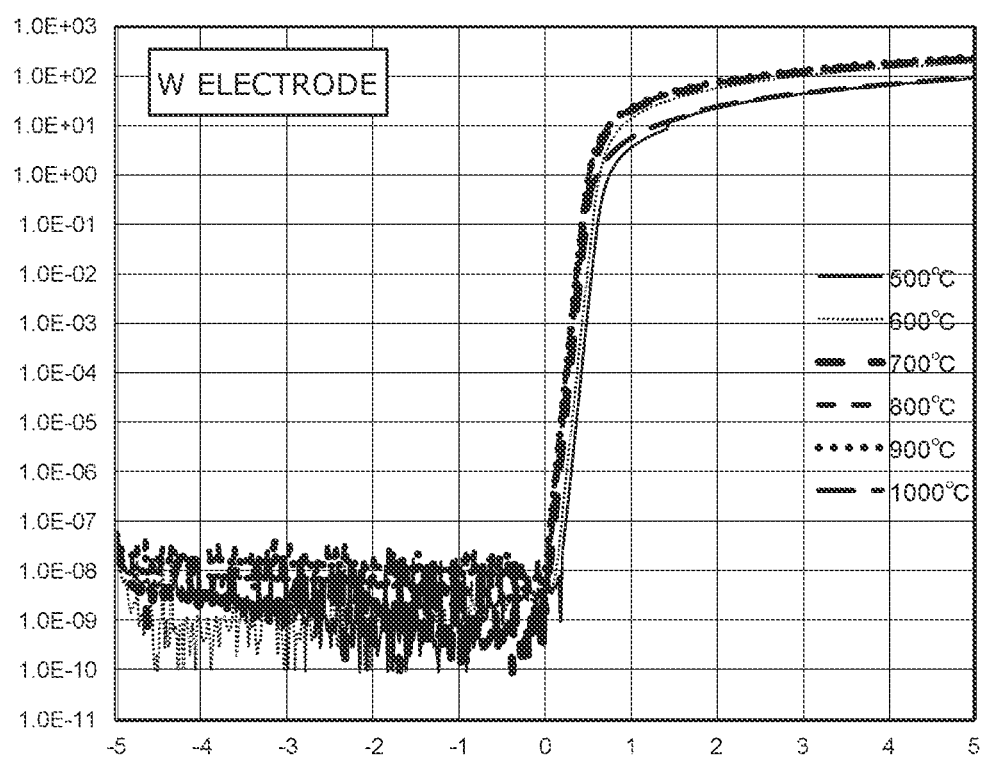
FIG. 12 is a diagram illustrating the I-V characteristics of a cell structure according to Example 2-3.
Figure 13:
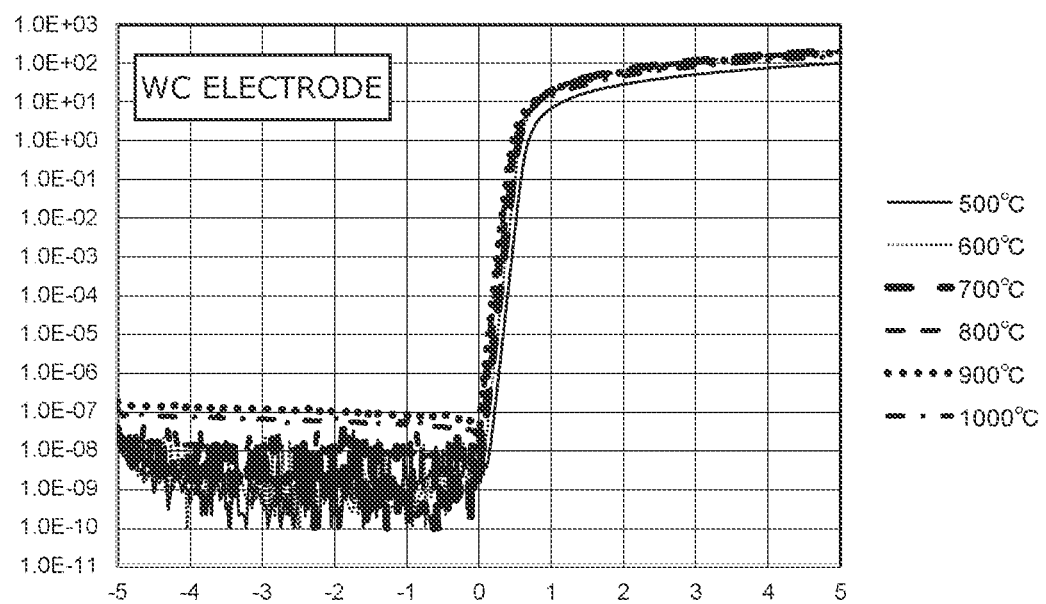
FIG. 13 is a diagram illustrating the I-V characteristics of a cell structure according to Example 2-4.
Figure 14:
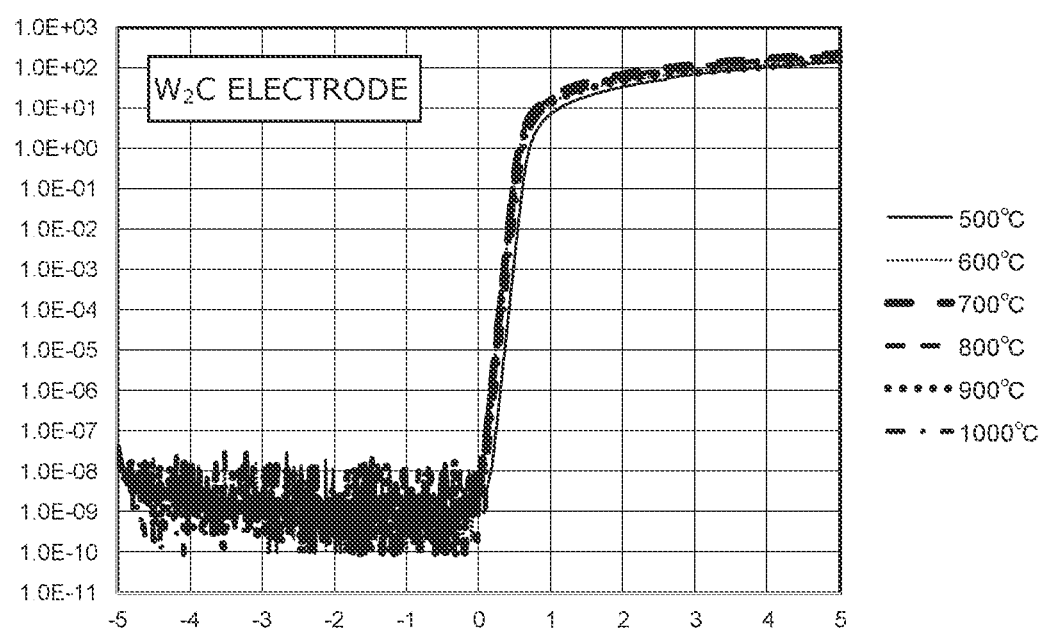
FIG. 14 is a diagram illustrating the I-V characteristics of a cell structure according to Example 2-5.

Also, the photon counting radiation detector according to one or more embodiments may be used in a radiation detector. FIG. 9 is a conceptual diagram of a radiation detector. In the diagram, 8 denotes a computer functioning as the control unit, 10 denotes the array structure, 21 denotes a test subject, 22 denotes an X-ray tube, 24 denotes a display, 25 denotes an image, 20 denotes an X-ray CT device (radiographic inspection device), and 100 denotes the photon counting radiation detector. An X-ray CT device, which is a type of radiographic inspection device, will now be described using FIG. 9.

The X-ray CT device 20 is provided with the photon counting radiation detector 100 including the array structure 10. In the array structure 10, the cell structures 1 are arranged side by side along a curve in the lateral direction. The array structure 10 is attached to the inner wall of a cylindrical body in which the portion of the test subject 21 to be imaged is placed. The X-ray tube 22 that emits X-rays is disposed roughly in the center of the arc along which the array structure 10 is attached. The test subject 21 is fixed and placed between the array structure 10 and the X-ray tube 22.

The array structure 10 and the X-ray tube 22 are configured to rotate about the test subject 21 in a rotation direction 23 while X-ray imaging is performed. In the image processing of the test subject 21, images are collected from different angles in a three-dimensional space. The signals obtained from the X-ray imaging (electrical signals obtained via conversion by the cell structure 1) are processed by the computer 8 and displayed as the image 25 on the display 24. The image 25 is a tomogram of the test subject 21, for example.

In the photon counting radiation detector 100 of one or more embodiments, the X-ray incident surface can be made smaller, allowing for higher resolution. This can dramatically increase the medical diagnostic capability of the X-ray CT device 20.

Also, the radiographic inspection device according to one or more embodiments is not limited to being applied to inspection devices for medical diagnosis and may also be applied to industrial X-ray non-destructive inspection devices. The radiographic inspection device according to one or more embodiments may also be used in detectors for radiation other than X-rays (for example, gamma rays).

Next, a method for manufacturing the photon counting radiation detector 100 according to one or more embodiments will be described. The photon counting radiation detector 100 according to one or more embodiments is only required to have the configuration described above and is not limited in terms of the manufacturing method. However, an example of a method that can produce a good yield is given below.

First, a substrate for forming an epitaxial layer is prepared. The substrate includes one type selected from SiC, $Ga_2O_3$, gallium arsenide (GaAs), gallium nitride (GaN), diamond, cadmium telluride (CdTe), IGZO, and a material having a perovskite crystal structure. Note that IGZO is a compound of indium (In), gallium (Ga), zinc (Zn), and oxygen (O).

The thickness $t_{sub}$ of the substrate preferably ranges from 10 μm to 700 μm, and more preferably ranges from 15 μm to 400 μm. Also, the substrate is preferably a single crystal substrate. The thickness of the single crystal substrate preferably ranges from 5 μm to 200 μm.

The size of the substrate in terms of length and width is discretionary. A substrate larger than the substrate 3 constituting a cell structure is preferably used. Forming cell structures by cutting smaller substrates from larger substrates with epitaxial growth improves mass productivity. Also, this cutting process may be performed before providing the electrodes or after providing the electrodes.

Furthermore, the purity of the substrate is preferably 99.0 wt % or greater. When the substrate has low purity, impurities are more likely to contaminate the epitaxial layer. Thus, the purity of the substrate is preferably 99.0 wt % or greater, and more preferably 99.9 wt % or greater. Also, the surface of the substrate is preferably a flat surface with a surface roughness Ra of 0.2 μm or less.

Next, epitaxial growth on the substrate is performed to form the epitaxial layer. Epitaxial growth is a method of growing a crystal on a crystal substrate. A crystal can be grown in the same orientation as the crystal surface of the substrate (substrate used as a base). When the substrate is a single crystal, a single crystal epitaxial layer can also be obtained.

Also, when the substrate and the epitaxial layer are the same material, the growth is called homoepitaxial growth. When the substrate and the epitaxial layer are different materials, the growth is called heteroepitaxial growth.

Furthermore, methods of epitaxial growth include vapor-phase epitaxy, liquid-phase epitaxy, solid-phase epitaxy, molecular-beam epitaxy, and the like.

Vapor-phase epitaxy is a method of depositing a component in the gas-phase on a substrate crystal surface. Vapor-phase epitaxy is also referred to as VPE or chemical vapor deposition (CVD). An example of a type of CVD includes mist CVD.

Also, liquid-phase epitaxy is also referred to as LPE and is a method in which a crystal component is precipitated from a super saturated solution onto a substrate crystal surface.

Solid-phase epitaxy is a method in which material deposited on a substrate crystal surface is heated by electron beam irradiation to change the structure of the material to the same crystal structure as the substrate crystal. Solid-phase epitaxy is also referred to as SPE.

Also, molecular-beam epitaxy is a method in which an element for forming the target crystal or a material including the element is heated and evaporated in an ultra-high vacuum (from $10^{-3}$ to $10^{-9}$ Pa) and a crystal is deposited on a heated substrate crystal. Molecular-beam epitaxy is also referred to as MBE.

Epitaxial growth is continued until the epitaxial layer reaches the target thickness. The grown epitaxial layer here corresponds to the epitaxial layer 2. The thickness of the epitaxial layer 2 is preferably 100 μm or less, and more preferably ranges from 1 μm to 30 μm.

After forming the epitaxial layer 2, the thickness $t_{sub}$ of the substrate is adjusted as necessary. A thinner thickness $t_{sub}$ of the substrate allows the spatial resolution to be improved. Thus, the thickness $t_{sub}$ of the substrate preferably ranges from 5 μm to 500 μm, and more preferably ranges from 5 μm to 100 μm. Also, the thickness $t_{sub}$ of the substrate can be reduced by machining/finishing and etching.

Next, the process of providing the electrodes is performed. The electrode material is preferably one type selected from a metal, a metal oxide, a metal carbide, and a metal silicide. Also, sputtering, chemical vapor deposition (CVD), ion plating, vapor deposition, thermal spraying, plating, and the like may be used as the film forming method. These film forming methods allow electrodes to be formed at discretionary locations. Also, the electrode may be formed on the entire front surface of the epitaxial layer 2 or may be formed on a portion of the front surface. Furthermore, a plurality of electrodes may be formed on the front surface of the epitaxial layer 2. In a similar manner, the electrode provided on the rear surface of the substrate 3 may be formed on the entire rear surface or may be formed on a portion of the rear surface. A plurality of electrodes may be formed on the rear surface of the substrate 3. Also, after an electrode is provided on the entire front surface of the epitaxial layer 2 or on the entire rear surface of the substrate 3, the electrode may be patterned via etching. Heat treatment may be performed in addition as necessary. Also, heating may be performed during the film forming of the electrode.

When the epitaxial layer 2 or the substrate 3 includes silicon carbide (SiC) or diamond, a metal carbide electrode or a metal silicide electrode is preferable. Among these, $Mo_2C$, W, WC, or $W_2C$ is preferable. When the epitaxial layer 2 and the substrate 3 include a carbon component, a metal carbide electrode or a metal silicide electrode can be used to help prevent a reaction between the electrode and the epitaxial layer or between the electrode and the substrate. In this way, stable electrical characteristics can be obtained. Also, the cell structure can have a long service life.

Also, when the epitaxial layer 2 or the substrate 3 includes gadolinium oxide ($Ga_2O_3$), gallium arsenide (GaAs), gallium nitride (GaN), or cadmium telluride (CdTe), a metal electrode or a metal oxide electrode is preferable. Among these, Pt, Ni, or $TiO_2$ is preferable. Also, the electrode may include titanium nitride (TiN). This can help suppress a reaction between the electrode and the epitaxial layer or between the electrode and the substrate.

In the process of forming cell structures, smaller substrates are cut from larger substrates with epitaxial growth as necessary.

The cell structures are completed via the process described above. Next, an array structure is manufactured by arranging the cell structures side by side. First, wiring is connected to the electrodes of each cell structure. Next, the cell structures are arranged side by side interposed by the spacers. Here, the cell structures are arranged with the inclination θ of the substrate satisfying Formula (1) with respect to the X-ray incident direction. The spacers preferably have insulating properties. The cell structures 1 are each provided with the front electrode 4 and the rear electrode 5. Providing insulating spacers allows for conduction between adjacent cell structures to be prevented. For example, the spacer 6 may be an insulating resin (including pressure-sensitive adhesives) or an insulating film. Also, an adhesive layer with insulating film on both sides, such as double-sided tape, may be used. The thickness of the spacer is preferably 200 μm or less, and more preferably 100 μm or less. By making the thickness of the spacer thin, the regions incapable of detection can be reduced and the spatial resolution can be increased. Note that the number of cell structures arranged side by side is a discretionary number.

Also, after the array structure is formed, the array structure may be resin-molded as necessary. Resin molding allows the strength of the array structure to be increased.

EXAMPLES

Examples 1 to 9, Comparative Example 1

SiC substrates according to Examples 1 to 3 were prepared. Epitaxial growth was performed on the SiC layer on the SiC substrate. For Examples 4 to 6, $Ga_2O_3$ substrates were prepared. Epitaxial growth was performed on the $Ga_2O_3$ layer on the $Ga_2O_3$ substrate. For Examples 7 to 9, GaN substrates were prepared. Epitaxial growth was performed on the GaN layer on the GaN substrate. A single crystal was used for the SiC substrates, the $Ga_2O_3$ substrates, and the GaN substrates. Thus, single crystal epitaxial layers were obtained.

Also, the sizes of the substrates and the epitaxial layers are as listed in Table 1. Furthermore, the thickness $t_{sub}$ of the substrate is a thickness that includes the thickness of the electrodes and the insulating layer.

TABLE 1

|  | Epitaxial layer | | | Substrate (including insulating layer) | | |
| --- | --- | --- | --- | --- | --- | --- |
|  | Material | Thickness $t_{epi}$ (μm) | Impurity concentration (cm$^{-3}$) | Material | Thickness $t_{sub}$ (μm) | Impurity concentration (cm$^{-3}$) |
| Example 1 | SiC | 2 | <$10^{15}$ | SiC | 360 | $10^{18}$ |
| Example 2 | SiC | 5 | <$10^{15}$ | SiC | 200 | $10^{18}$ |
| Example 3 | SiC | 10 | <$10^{15}$ | SiC | 150 | $10^{18}$ |
| Example 4 | $Ga_2O_3$ | 2 | <$10^{15}$ | $Ga_2O_3$ | 50 | $10^{18}$ |
| Example 5 | $Ga_2O_3$ | 4 | <$10^{15}$ | $Ga_2O_3$ | 100 | $10^{18}$ |
| Example 6 | $Ga_2O_3$ | 8 | <$10^{15}$ | $Ga_2O_3$ | 150 | $10^{18}$ |
| Example 7 | GaN | 2 | <$10^{15}$ | GaN | 50 | $10^{18}$ |
| Example 8 | GaN | 4 | <$10^{15}$ | GaN | 100 | $10^{18}$ |
| Example 9 | GaN | 8 | <$10^{15}$ | GaN | 150 | $10^{18}$ |

Next, for Examples 1 to 9, electrode layers were provided. The material of the electrode layers is as listed in Table 2. Note that the front electrode and the rear electrode have the same material, and the film thickness is 20 μm in all Examples. In this way, cell structures according to the Examples were manufactured. Also, an insulating layer ranging from 10 μm to 150 μm was used, this value being included in the thickness $t_{sub}$ of the substrate listed in Table 1.

TABLE 2

|  | Sample | Electrode material |
|---|---|---|
| Example 1-1 | Example 1 | WC |
| Example 2-1 | Example 2 | TiC |
| Example 2-2 | Example 2 | Mo$_2$C |
| Example 2-3 | Example 2 | W |
| Example 2-4 | Example 2 | WC |
| Example 2-5 | Example 2 | W$_2$C |
| Example 3-1 | Example 3 | WC |
| Example 4-1 | Example 4 | TiN |
| Example 5-1 | Example 5 | TiN |
| Example 6-1 | Example 6 | Ni |
| Example 7-1 | Example 7 | Pt |
| Example 8-1 | Example 8 | Ni |
| Example 9-1 | Example 9 | Ni |

The I-V characteristics of the cell structures of Examples 2-1 to 2-5 were examined. The I-V characteristics were examined after heat treating the cell structures at temperatures of 500° C., 700° C., 800° C., 900° C., and 1000° C. in a nitrogen atmosphere for 1 minute. The I-V characteristics of Examples 2-1 to 2-5 are shown in FIGS. 10 to 14. For the I-V characteristics shown in FIGS. 10 to 14, the horizontal axis indicates voltage (V), and the vertical axis indicates current density (A/cm$^2$). Also, in FIGS. 10 to 14, asdepo indicates the characteristics of the unheat treated cell structure. The I-V characteristics shown in FIGS. 10 to 14 were used to examine for increases in the reverse leakage current at each temperature of the heat treatment. Large differences in the I-V characteristics graph at the different heat treatment temperatures indicate an increase in the reverse leakage current. Also, a large current density when the voltage is in the negative region indicates a large reverse leakage current.

By comparing FIGS. 10 to 14, it can be seen that the TiC electrode (FIG. 10) has a strong tendency toward an increase in the reverse leakage current. Compared to this, the Mo$_2$C electrode (FIG. 11), the W electrode (FIG. 12), the WC electrode (FIG. 13), and the W$_2$C electrode (FIG. 14) have little reverse leakage current. This tells us that, in a cell structure using a SiC epitaxial layer or a SiC substrate, the electrode material is preferably one type selected from Mo$_2$C, W, WC, and W$_2$C.

Also, cell structures using a Ga$_2$O$_3$ epitaxial layer or a GaN epitaxial layer also followed this pattern.

The cell structures were manufactured with the substrate lengths L listed in Table 3. Array structures were manufactured by arranged the cell structures side by side. Also, the length L of each cell are the values listed in Table 3. The sizes in terms of length and width are the same. Also, the inclination θ of each substrate of the array structures are the values listed in Table 3.

Next, the inclination θ of the substrate of the cell structure with respect to the X-ray incident direction was changed, and X-ray detection was examined. When X-ray detection was examined, the presence of detection contamination was examined. The pixel size is also listed. The pixel size is found via $(t_{sub}+t_{epi})/\cos\theta$. In the Examples, Mathematical Formula 1 is satisfied, but in the Comparative Examples, Formula (1) is not satisfied. In Table 3, configurations that satisfy Formula (1) are marked by "○", and configurations that do not satisfy Formula (1) are marked by "x".

The results are listed in Table 3.

TABLE 3

|  | Cell structure | Substrate length L | Mathematical Formula 1 | Inclination θ of substrate (°) | Pixel size (μm) | Detection contamination |
|---|---|---|---|---|---|---|
| Example A | Example 1-1 | 1 cm | ○ | 50 | 563 | No |
| Example B | Example 1-1 | 1 mm | ○ | 10 | 368 | No |
| Comparative Example A | Example 1-1 | 1 mm | x | 40 | 472 | Yes |
| Example C | Example 2-1 | 1 cm | ○ | 1 | 205 | No |
| Example D | Example 2-2 | 1 mm | ○ | 1 | 205 | No |
| Example E | Example 2-3 | 1 mm | ○ | 3 | 205 | No |
| Example F | Example 2-4 | 1 mm | ○ | 5 | 205 | No |
| Example G | Example 2-5 | 1 mm | ○ | 10 | 208 | No |
| Comparative Example B | Example 2-2 | 1 mm | x | 25 | 226 | Yes |
| Example H | Example 3-1 | 1 cm | ○ | 0.6 | 160 | No |
| Example I | Example 3-1 | 1 mm | ○ | 6 | 160 | No |
| Comparative Example C | Example 3-1 | 1 cm | x | 20 | 170 | Yes |
| Example J | Example 4-1 | 1 cm | ○ | 0.3 | 52 | No |
| Example K | Example 4-1 | 1 mm | ○ | 2 | 52 | No |
| Example M | Example 5-1 | 1 cm | ○ | 1 | 104 | No |
| Example N | Example 5-1 | 1 mm | ○ | 4 | 104 | No |
| Example O | Example 6-1 | 1 cm | ○ | 1 | 158 | No |
| Example P | Example 6-1 | 1 mm | ○ | 6 | 159 | No |
| Comparative Example D | Example 6-1 | 1 mm | x | 20 | 168 | Yes |
| Example Q | Example 7-1 | 1 mm | ○ | 2 | 52 | No |

TABLE 3-continued

|  | Cell structure | Substrate length L | Mathematical Formula 1 | Inclination θ of substrate (°) | Pixel size (μm) | Detection contamination |
|---|---|---|---|---|---|---|
| Example R | Example 8-1 | 1 cm | o | 1 | 104 | No |
| Example S | Example 9-1 | 1 mm | o | 6 | 159 | No |
| Comparative Example E | Example 7-1 | 1 mm | x | 20 | 168 | Yes |

Radiation detectors according to the embodiments described above exhibit excellent performance. In the Examples, due to Formula (1) being satisfied, no detection contamination in adjacent cell structures was found. Also, it can be seen that even in configurations with the same substrate length L, for example, Example B and Comparative Example A, when the inclination θ of the substrate satisfies Formula (1), the detection pixel can be made smaller. Thus, higher resolution can be achieved.

Also, photon counting radiation detectors according to the Examples display good sensitivity due to the detection layer being an epitaxial layer. Furthermore, even when the pixel size is reduced to 1 mm (1000 μm) or less, X-ray photons can be detected.

Photon counting radiation detectors according to the Examples are also capable of detecting a current of a few μA (microamperes) based on an X-ray photon. Furthermore, it was confirmed that increasing the inclination θ of the substrate increases the detection current. This is because the distance of the X-rays passing through the epitaxial layer is increased.

Embodiments of the invention have been described above. However, these embodiments are presented as examples are not intended to limit the scope of the invention. These novel embodiments may be implemented in various other forms, and various omissions, substitutions, modifications, and the like can be made without departing from the spirit of the invention. These embodiments and modifications thereof are included in the scope and spirit of the invention and are included within the scope and equivalents thereof set forth in the claims. Also, the embodiments described above can be combined with one another.

$$\theta \leq \tan\theta \leq \frac{L \pm \sqrt{L^2 - 4t_{sub}(t_{sub} + t_{epi})}}{2(t_{sub} + t_{epi})} \quad (1)$$

$$\left(L - \frac{t_{sub}}{\tan\theta}\right)\sin\theta = \frac{t_{sub} + t_{epi}}{\cos\theta} - (t_{sub} + t_{epi})\cos\theta \quad (2)$$

$$L - \frac{t_{sub}}{\tan\theta} = (t_{sub} + t_{epi})\left(\frac{1 + \tan^2\theta}{\tan\theta} - \frac{1}{\tan\theta}\right) = (t_{sub} + t_{epi})\tan\theta \quad (3)$$

$$0 \leq L^2 - 4t_{sub}(t_{sub} + t_{epi}) \quad (4)$$

TABLE 1

|  | Epitaxial layer | | | Substrate (including insulating layer) | | |
|---|---|---|---|---|---|---|
|  | Material | Thickness $t_{epi}$ (μm) | Impurity concentration (cm$^{-3}$) | Material | Thickness $t_{sub}$ (μm) | Impurity concentration (cm$^{-3}$) |
| Example 1 | SiC | 2 | <10$^{15}$ | SiC | 360 | 10$^{18}$ |
| Example 2 | SiC | 5 | <10$^{15}$ | SiC | 200 | 10$^{18}$ |
| Example 3 | SiC | 10 | <10$^{15}$ | SiC | 150 | 10$^{18}$ |
| Example 4 | Ga$_2$O$_3$ | 2 | <10$^{15}$ | Ga$_2$O$_3$ | 50 | 10$^{18}$ |
| Example 5 | Ga$_2$O$_3$ | 4 | <10$^{15}$ | Ga$_2$O$_3$ | 100 | 10$^{18}$ |
| Example 6 | Ga$_2$O$_3$ | 8 | <10$^{15}$ | Ga$_2$O$_3$ | 150 | 10$^{18}$ |
| Example 7 | GaN | 2 | <10$^{15}$ | GaN | 50 | 10$^{18}$ |
| Example 8 | GaN | 4 | <10$^{15}$ | GaN | 100 | 10$^{18}$ |
| Example 9 | GaN | 8 | <10$^{15}$ | GaN | 150 | 10$^{18}$ |

| Sample | | Electrode material |
|---|---|---|
| Example 1-1 | Example 1 | WC |
| Example 2-1 | Example 2 | TiC |
| Example 2-2 | Example 2 | Mo$_2$C |
| Example 2-3 | Example 2 | W |
| Example 2-4 | Example 2 | WC |
| Example 2-5 | Example 2 | W$_2$C |
| Example 3-1 | Example 3 | WC |
| Example 4-1 | Example 4 | TiN |
| Example 5-1 | Example 5 | TiN |
| Example 6-1 | Example 6 | Ni |
| Example 7-1 | Example 7 | Pt |
| Example 8-1 | Example 8 | Ni |
| Example 9-1 | Example 9 | Ni |

TABLE 3

| | Cell structure | Substrate length L | Mathematical Formula 1 | Inclination θ of substrate (°) | Pixel size (μm) | Detection contamination |
|---|---|---|---|---|---|---|
| Example A | Example 1-1 | 1 cm | ○ | 50 | 563 | No |
| Example B | Example 1-1 | 1 mm | ○ | 10 | 368 | No |
| Comparative Example A | Example 1-1 | 1 mm | x | 40 | 472 | Yes |
| Example C | Example 2-1 | 1 cm | ○ | 1 | 205 | No |
| Example D | Example 2-2 | 1 mm | ○ | 1 | 205 | No |
| Example E | Example 2-3 | 1 mm | ○ | 3 | 205 | No |
| Example F | Example 2-4 | 1 mm | ○ | 5 | 205 | No |
| Example G | Example 2-5 | 1 mm | ○ | 10 | 208 | No |
| Comparative Example B | Example 2-2 | 1 mm | x | 25 | 226 | Yes |
| Example H | Example 3-1 | 1 cm | ○ | 0.6 | 160 | No |
| Example I | Example 3-1 | 1 mm | ○ | 6 | 160 | No |
| Comparative Example C | Example 3-1 | 1 cm | x | 20 | 170 | Yes |
| Example J | Example 4-1 | 1 cm | ○ | 0.3 | 52 | No |
| Example K | Example 4-1 | 1 mm | ○ | 2 | 52 | No |
| Example M | Example 5-1 | 1 cm | ○ | 1 | 104 | No |
| Example N | Example 5-1 | 1 mm | ○ | 4 | 104 | No |
| Example O | Example 6-1 | 1 cm | ○ | 1 | 158 | No |
| Example P | Example 6-1 | 1 mm | ○ | 6 | 159 | No |
| Comparative Example D | Example 6-1 | 1 mm | x | 20 | 168 | Yes |
| Example Q | Example 7-1 | 1 mm | ○ | 2 | 52 | No |
| Example R | Example 8-1 | 1 cm | ○ | 1 | 104 | No |
| Example S | Example 9-1 | 1 mm | ○ | 6 | 159 | No |
| Comparative Example E | Example 7-1 | 1 mm | x | 20 | 168 | Yes |

What is claimed is:

1. A photon counting radiation detector, comprising:
a cell structure including
a substrate, and
an epitaxial layer provided on the substrate, radiation being incident on the epitaxial layer;
an inclination θ of the substrate satisfying Formula (1) below, where $t_{sub}$ is a thickness of the substrate, $t_{epi}$ is a thickness of the epitaxial layer, L is a length of the substrate, and the inclination θ is an inclination of the substrate with respect to an incident direction of the radiation and is greater than 0°:

$$\theta \leq \tan \theta \leq \frac{L \pm \sqrt{L^2 - 4t_{sub}(t_{sub} + t_{epi})}}{2(t_{sub} + t_{epi})}. \quad (1)$$

2. The photon counting radiation detector according to claim 1, wherein
the thickness of the substrate is 500 μm or less.

3. The photon counting radiation detector according to claim 1, wherein
the thickness of the epitaxial layer is 100 μm or less.

4. The photon counting radiation detector according to claim 1, wherein the epitaxial layer includes one type selected from SiC, Ga$_2$O$_3$, GaAs, GaN, diamond, and CdTe.

5. The photon counting radiation detector according to claim 1, wherein
the cell structure further includes an electrode.

6. The photon counting radiation detector according to claim 5, wherein
the electrode provided in the cell structure includes one or more types selected from the group consisting of carbon, silicon, titanium, platinum, and nickel.

7. The photon counting radiation detector according to claim 1, further comprising
an array structure including a plurality of the cell structures and a plurality of insulating spacers provided between adjacent pairs of the plurality of cell structures, the plurality of cell structures and the plurality of insulating spacers being alternately arranged side by side in a lateral direction.

8. The photon counting radiation detector according to claim 7, further comprising
a plurality of the array structures stacked in the incident direction of the radiation.

9. The photon counting radiation detector according to claim 1, wherein the photon counting radiation detector is a direct converting type.

10. A radiographic inspection device, comprising:
the photon counting radiation detector according to claim 1.

11. The photon counting radiation detector according to claim 1, wherein
the thickness of the substrate is 500 μm or less, and
the thickness of the epitaxial layer is 100 μm or less.

12. The photon counting radiation detector according to claim 11, wherein
the cell structure further includes an electrode.

13. The photon counting radiation detector according to claim 12, wherein
the electrode provided in the cell structure includes one or more types selected from the group consisting of carbon, silicon, titanium, platinum, and nickel.

* * * * *